(12) United States Patent
Ong et al.

(10) Patent No.: US 11,196,969 B2
(45) Date of Patent: Dec. 7, 2021

(54) IMAGE CAPTURE DISPLAY (71) Applicant: Google LLC, Mountain View, CA (US)

(72) Inventors: Tony Ong, San Jose, CA (US); Steven Fong, Sunnyvale, CA (US); Yichi Chen, New Taipei (TW)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/561,642

(22) Filed: Sep. 5, 2019

(65) Prior Publication Data

US 2020/0092522 A1 Mar. 19, 2020

Related U.S. Application Data

(60) Provisional application No. 62/731,412, filed on Sep. 14, 2018.

(51) Int. Cl.
| | |
|---|---|
| *H04N 9/04* | (2006.01) |
| *H04N 5/369* | (2011.01) |
| *G09G 3/20* | (2006.01) |
| *G02F 1/1368* | (2006.01) |
| *G02F 1/1335* | (2006.01) |
| *H01L 27/146* | (2006.01) |
| *H01L 27/32* | (2006.01) |

(52) U.S. Cl.
CPC .......... *H04N 9/045* (2013.01); *G02F 1/1368* (2013.01); *G02F 1/133514* (2013.01); *G09G 3/2003* (2013.01); *H01L 27/14621* (2013.01); *H01L 27/14625* (2013.01); *H01L 27/322* (2013.01); *H04N 5/36961* (2018.08); *H04N 9/04557* (2018.08); *G02F 2201/52* (2013.01); *G09G 2320/0247* (2013.01); *G09G 2330/027* (2013.01)

(58) Field of Classification Search
CPC .. H04N 9/04555; H04N 5/3696; H04N 9/045; H04N 5/36961; H04N 9/04557; G02F 1/13318; G02F 1/1368; G02F 1/133514; G02F 2201/52; H01L 27/288; H01L 27/14625; H01L 27/14621; H01L 27/322; G09G 3/3607; G09G 3/2003; G09G 2330/027; G09G 2320/0247; G09G 2300/0452; G09G 2360/142; G09G 2360/144; G09G 2360/148
See application file for complete search history.

(56) References Cited

U.S. PATENT DOCUMENTS

| | | |
|---|---|---|
| 7,460,160 B2 | 12/2008 | Hershey et al. |
| 7,767,949 B2 | 8/2010 | Perlman et al. |
| 9,723,241 B2 | 8/2017 | Yeh et al. |

(Continued)

OTHER PUBLICATIONS

International Search Report and Written Opinion for Application No. PCT/US2019/050391, dated Nov. 20, 2019, 15 pages.

*Primary Examiner* — Nhan T Tran
*Assistant Examiner* — Tuan H Le
(74) *Attorney, Agent, or Firm* — Brake Hughes Bellermann LLP (57) ABSTRACT

A display that includes a plurality of contiguous pixel areas. Each pixel area is divided into subpixels for displaying and a photodetector for imaging. The display can be configured into a display mode to display information using the subpixels for displaying or an imaging mode to capture image information using the photodetectors for imaging.

20 Claims, 9 Drawing Sheets

(56) References Cited

U.S. PATENT DOCUMENTS

| | | | |
|---|---|---|---|
| 2007/0014019 A1* | 1/2007 | Mouli | H01L 27/14627 359/619 |
| 2011/0105185 A1* | 5/2011 | Heald | G02B 26/001 455/566 |
| 2012/0026140 A1* | 2/2012 | Chuang | G09G 3/3648 345/207 |
| 2014/0354597 A1* | 12/2014 | Kitchens, II | G06F 3/043 345/175 |
| 2016/0329024 A1* | 11/2016 | Maeda | G09G 3/3648 |
| 2017/0140702 A1 | 5/2017 | Li et al. | |
| 2017/0242533 A1 | 8/2017 | Liu et al. | |
| 2017/0330920 A1* | 11/2017 | Tanaka | H01L 27/323 |
| 2018/0240851 A1* | 8/2018 | Liu | H01L 51/56 |
| 2020/0043962 A1* | 2/2020 | Cho | H01L 27/14605 |

\* cited by examiner

| R | G | R | G | R | G | R | G | R | G | R | G | R | G |
|---|---|---|---|---|---|---|---|---|---|---|---|---|---|
| B | OFF | B | OFF | B | OFF | B | OFF | B | OFF | B | OFF | B | OFF |
| R | G | R | G | R | G | R | G | R | G | R | G | R | G |
| B | OFF | B | OFF | B | OFF | B | OFF | B | OFF | B | OFF | B | OFF |
| R | G | R | G | R | G | R | G | R | G | R | G | R | G |
| B | OFF | B | OFF | B | OFF | B | OFF | B | OFF | B | OFF | B | OFF |
| R | G | R | G | R | G | R | G | R | G | R | G | R | G |
| B | OFF | B | OFF | B | OFF | B | OFF | B | OFF | B | OFF | B | OFF |
| R | G | R | G | R | G | R | G | R | G | R | G | R | G |
| B | OFF | B | OFF | B | OFF | B | OFF | B | OFF | B | OFF | B | OFF |
| R | G | R | G | R | G | R | G | R | G | R | G | R | G |
| B | OFF | B | OFF | B | OFF | B | OFF | B | OFF | B | OFF | B | OFF |
| R | G | R | G | R | G | R | G | R | G | R | G | R | G |
| B | OFF | B | OFF | B | OFF | B | OFF | B | OFF | B | OFF | B | OFF |
| R | G | R | G | R | G | R | G | R | G | R | G | R | G |
| B | OFF | B | OFF | B | OFF | B | OFF | B | OFF | B | OFF | B | OFF |

FIG. 6

| OFF | OFF | OFF | OFF | OFF | OFF | OFF | OFF | OFF | OFF | OFF | OFF | OFF | OFF |
|-----|-----|-----|-----|-----|-----|-----|-----|-----|-----|-----|-----|-----|-----|
| OFF | P   | OFF | P   | OFF | P   | OFF | P   | OFF | P   | OFF | P   | OFF | P   |
| OFF | OFF | OFF | OFF | OFF | OFF | OFF | OFF | OFF | OFF | OFF | OFF | OFF | OFF |
| OFF | P   | OFF | OFF | OFF | OFF | OFF | P   | OFF | P   | OFF | P   | OFF | P   |
| OFF | OFF | OFF | OFF | OFF | OFF | OFF | OFF | OFF | OFF | OFF | OFF | OFF | OFF |
| OFF | P   | OFF | OFF | OFF | OFF | OFF | P   | OFF | P   | OFF | P   | OFF | P   |
| OFF | OFF | OFF | OFF | OFF | OFF | OFF | OFF | OFF | OFF | OFF | OFF | OFF | OFF |
| OFF | P   | OFF | P   | OFF | P   | OFF | P   | OFF | P   | OFF | P   | OFF | P   |
| OFF | OFF | OFF | OFF | OFF | OFF | OFF | OFF | OFF | OFF | OFF | OFF | OFF | OFF |
| OFF | P   | OFF | OFF | OFF | OFF | OFF | P   | OFF | P   | OFF | P   | OFF | P   |
| OFF | OFF | OFF | OFF | OFF | OFF | OFF | OFF | OFF | OFF | OFF | OFF | OFF | OFF |
| OFF | P   | OFF | OFF | OFF | OFF | OFF | P   | OFF | P   | OFF | P   | OFF | P   |
| OFF | OFF | OFF | OFF | OFF | OFF | OFF | OFF | OFF | OFF | OFF | OFF | OFF | OFF |
| OFF | P   | OFF | OFF | OFF | OFF | OFF | P   | OFF | P   | OFF | P   | OFF | P   |
| OFF | OFF | OFF | OFF | OFF | OFF | OFF | OFF | OFF | OFF | OFF | OFF | OFF | OFF |
| OFF | P   | OFF | P   | OFF | P   | OFF | P   | OFF | P   | OFF | P   | OFF | P   |
| OFF | OFF | OFF | OFF | OFF | OFF | OFF | OFF | OFF | OFF | OFF | OFF | OFF | OFF |
| OFF | P   | OFF | P   | OFF | P   | OFF | P   | OFF | P   | OFF | P   | OFF | P   |

FIG. 7

| P | P | P | 0x0 | 0x0 | 0x0 | 0x0 |
|---|---|---|---|---|---|---|
| P | 0x0 | 0x0 | P | 0x0 | 0x0 | 0x0 |
| P | 0x0 | 0x0 | P | 0x0 | 0x0 | 0x0 |
| P | P | P | 0x0 | 0x0 | 0x0 | 0x0 |
| P | 0x0 | 0x0 | P | 0x0 | 0x0 | 0x0 |
| P | 0x0 | 0x0 | P | 0x0 | 0x0 | 0x0 |
| P | 0x0 | 0x0 | P | 0x0 | 0x0 | 0x0 |
| P | P | P | 0x0 | 0x0 | 0x0 | 0x0 |
| 0x0 | 0x0 | 0x0 | 0x0 | 0x0 | 0x0 | 0x0 |

IMAGE CAPTURE DISPLAY

CROSS-REFERENCE TO RELATED APPLICATION

This application claims the benefit of U.S. Provisional Application No. 62/731,412, filed on Sep. 14, 2018 and entitled "IMAGE CAPTURE DISPLAY," the disclosure of which is hereby incorporated by reference in its entirety.

FIELD OF THE DISCLOSURE

The present disclosure relates to a display for a mobile computing device and more specifically to a liquid crystal display having display elements replaced by imaging elements at positions distributed over the area of the display.

BACKGROUND

A front surface of a smart phone must accommodate a display and a front facing camera. It may be desirable to expand the area allocated for the display without making the smart phone larger. Accordingly, new circuits and techniques are needed for alternatives to traditional front facing cameras.

SUMMARY

In one aspect, the present disclosure describes a display having display and imaging elements. The integrated display and imaging elements may be used to display information and obtain images from within the same area on a front surface of a mobile computing device (e.g., smart phones, tablets, etc.).

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

Like reference symbols in the various drawings indicate like elements.

DETAILED DESCRIPTION

Displays, such as those for mobile computing devices (e.g., smart phones, tablets, etc.), may use Bayer filters to combine red, green, and blue (RGB) color information with intensity for displaying color images. A Bayer filter may include four subpixels (i.e., dots). Each subpixel can be arranged in a square grid pattern and each subpixel can have an associated subpixel filter to provide color information. Various possible color combinations of subpixel filters may be used to display color images. The subpixel filters may include (but are not limited to) a blue (B) filter and a red (R) filter and two green (G) filters.

In an LCD, the Bayer filter layer is positioned in front of a display layer (i.e., the Bayer layer positioned between the display layer and a viewer when the viewer is viewing the display in normal operation). The display layer can include thin-film-transistor (TFT) LCD pixels that are electrically addressed to adjust (i.e., spatially modulate) the intensity of light transmitted through each pixel. A reflective layer can be positioned behind the display layer to direct (white) light from a source to the display layer where the light's intensity is modulated before being transmitted through the Bayer filter and presented to a viewer.

Figure 1A:
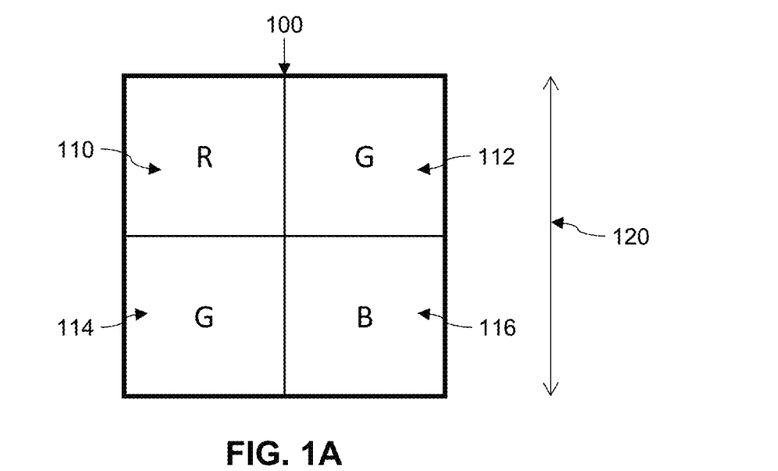
FIG. 1A depicts a front view of a Bayer filter for a liquid crystal display pixel.

A Bayer filter for a TFT LCD display is shown in FIG. 1A. The Bayer filter 100 of the TFT LCD has four subpixel filters 110, 112, 114, 116 that are arranged in a grid corresponding to the area of a display pixel. Each subpixel filter can be a red (R) 110, a green (G) 112,114, or a blue (B) 116 filter. As shown, the Bayer filter for the TFT LCD display has two green filters 112, 114 arranged on opposite corners of the Bayer filter.

Figure 1B:
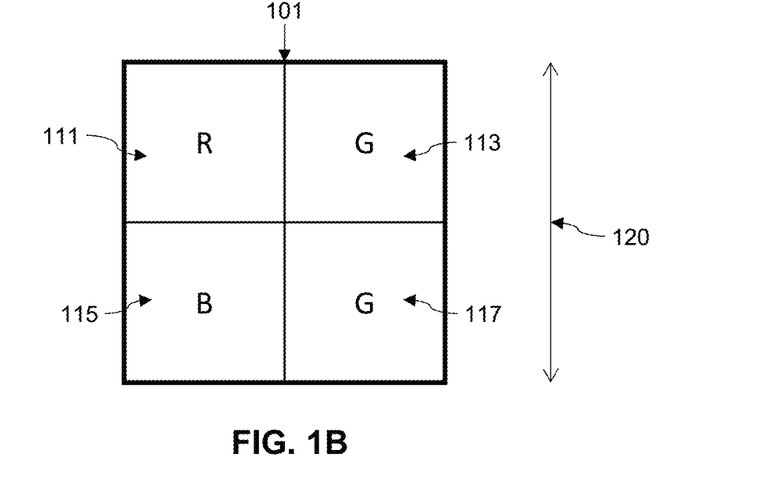
FIG. 1B depicts a front view of a Bayer filter for an organic light emitting diode display pixel.

The present disclosure is not limited to TFT LCD displays. Displays having color pixels arranged in a Bayer pattern may be used as well. For example, a display layer may include organic light emitting diodes (OLED) that are electrically addressed to provide light without the need of the white light source and reflection layer. The R, G, and B intensity can be modulated by controlling each OLED subpixel. The R, G, and B OLED subpixels may be arranged in a Bayer pattern as shown in FIG. 1B. The Bayer pattern 101 of the OLED display has four subpixels 111, 113, 115, 117 that are arranged in a grid that corresponds to the area of a display pixel. The subpixels include a red (R) 111, a green (G) 113, 117, and a blue (B) 115 subpixel. The Bayer pattern 101 for the OLED display has two green subpixels 113, 117 arranged adjacent to each other on one side.

The display pixels for the TFT LCD (FIG. 1A) and the display pixels for the OLED display (FIG. 1B) may be square with a side dimension 120 of approximately (e.g., within 10% of) 28 micrometers (μm). The subpixels of each display pixel may each be square with a lateral dimension of approximately half that of the display pixel (e.g., 14 μm). As an example, there are 441 pixels per inch in a 5 inch display having 1920×1080 resolution. This implies that each display pixel is 28.8 micrometers (μm). A front facing (i.e., selfie) camera can have a resolution as high as 3264×2448 (i.e., 8 megapixel) but is typically rated at 1080 pixels at 30 frames per second (fps). This implies that a lateral dimension of each imaging pixel is 1.4 μm. While a higher resolution may be possible, it is limited based on constraints of the mobile computing device (e.g., display resolution, processing/memory resources, image quality (noise), etc.).

Based on the example above, the area of a 28 μm display pixel can easily accommodate an imaging element having a size corresponding to the 1.4 μm imaging pixel size. In fact, each imaging element may be sized larger to improve imaging. For example, a 20 times larger imaging element (e.g., a 28 μm imaging element) may facilitate improved light collection and color response, etc.).

The images produced by imaging elements integrated within the display have a resolution that is linked to the resolution of the display. This may result in lower resolution images, which may reduce the processing requirements (e.g., power requirements) on the mobile computing device.

An aspect of the present disclosure is the recognition that one of the two green elements in each Bayer filter (or Bayer pattern) may be eliminated without loss of information necessary for displaying color images. In other words, each Bayer filter (or Bayer pattern) includes an "extra" green (G) subpixel. Accordingly, positions on the display that correspond to the extra green subpixel may be used for a different purpose. Thus, another aspect of the present disclosure includes using the positions of a display that are normally occupied by a green subpixel to receive light (i.e., for imaging) rather than to transmit light (i.e., for displaying).

Figure 2A:
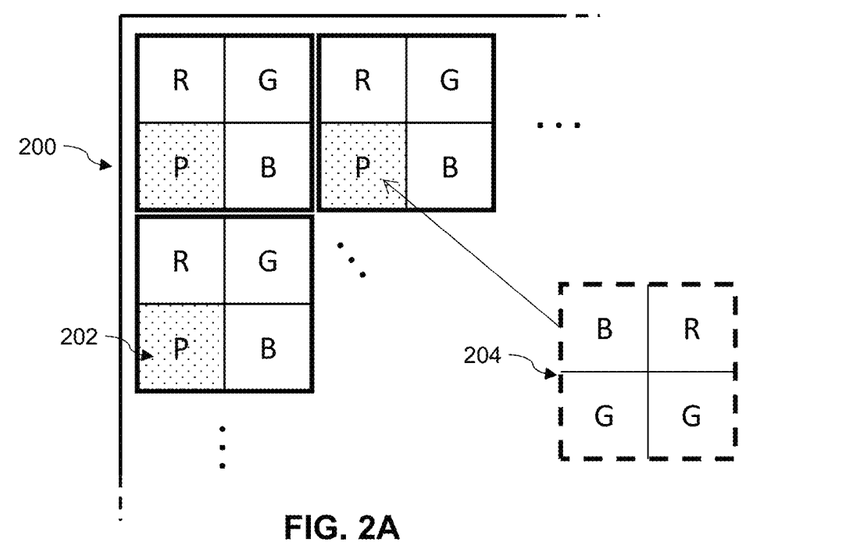
FIG. 2A depicts a front view of a portion of a TFT LCD according to an embodiment of the present disclosure.

FIG. 2A illustrates a portion of a TFT LCD 200 according to an embodiment of the present disclosure. As shown, subpixel positions normally occupied by a green subpixel (i.e., G 114) are replaced with a photodetector 202 (P). Each photodetector 202 may include its own set of subpixels and a Bayer filter 204 for capturing color information. In some embodiments, each photodetector 202 may include a plurality of imaging pixels and a lens for imaging an image onto the plurality of pixels.

Figure 2B:
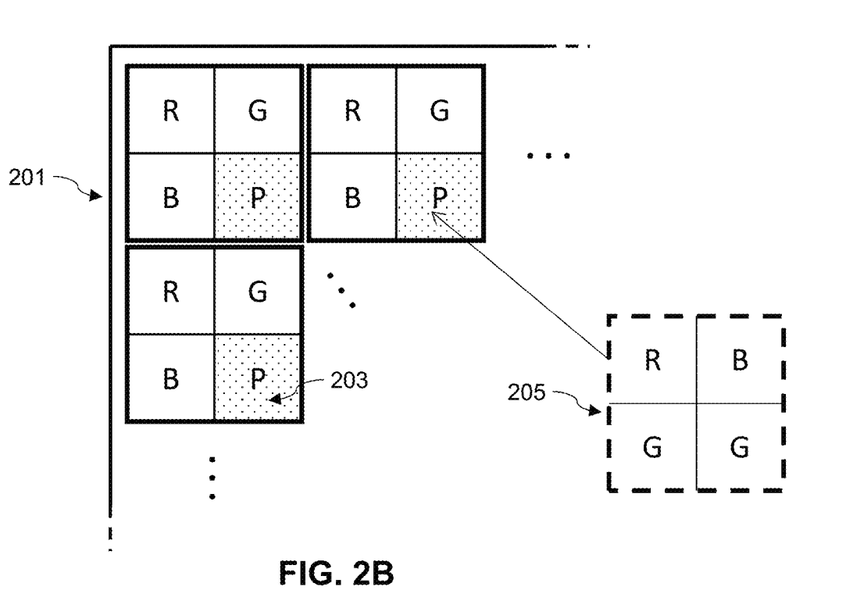
FIG. 2B depicts a front view of a portion of an OLED display according to an embodiment of the present disclosure.

FIG. 2B illustrates a portion of an OLED 201 according to an embodiment of the present disclosure. As shown, subpixel positions normally occupied by a green subpixel (i.e., G 117) are replaced with a photodetector 203 (P). Each photodetector 203 may include its own set of subpixels and a Bayer filter 205 for capturing color information. In some embodiments, each photodetector 203 may include a plurality of imaging pixels and a lens for imaging an image onto the plurality of pixels.

Figure 3:
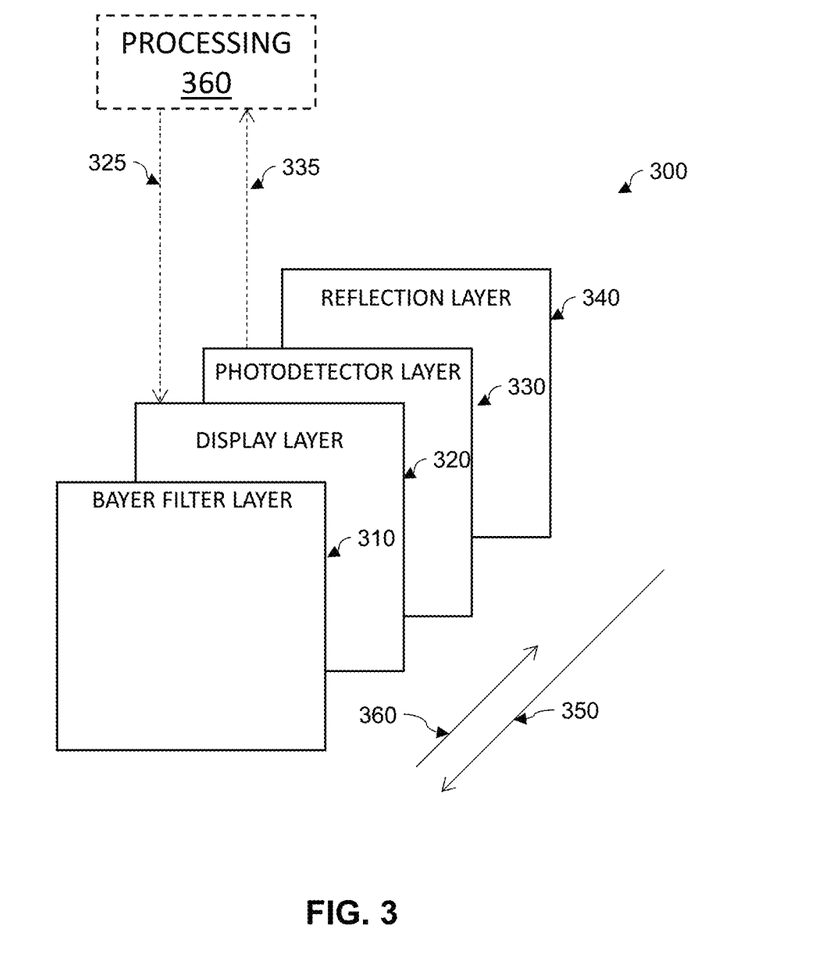
FIG. 3 depicts an exploded view of layers in an image capture display according to an embodiment of the present disclosure.

The display includes plurality of contiguous pixel areas. Each pixel area is divided into subpixels for displaying and a photodetector for imaging. The incorporation of subpixels for displaying with the photodetector for imaging in the same pixel area may be accomplished in variety of ways. In one possible embodiment, a photodetector layer is added to layers of a TFT LCD. An exploded view of an image capture display 300 based on a TFT LCD is shown FIG. 3. In this embodiment, the extra G filter 114, in each Bayer filter 100 on a Bayer filter layer 310 may be replaced with a clear filter or lens to allow all visible wavelengths to be received by a photodetector (e.g., pinned photodiode) on the photodetector layer 330 positioned behind a display layer 320. The image capture display operated in one of two modes. When the display is in a first mode (i.e., a display mode) light originating from light source (not shown) is (i) redirected by a reflection layer 340, (ii) passed through the photodetector layer 330, (iii) spatially modulated by subpixels in the display layer 320 and (iv) colorized by Bayer subpixel filters in the Bayer filter layer 310. In other words, while in the first (display) mode the display transmits light to a viewer along a first direction 350. When the display is in a second mode (i.e., imaging mode) light from a field of view (FOV) is passed through the Bayer filter layer 310 and the display layer 320 before reaching a photodetectors on the photodetector layer 330. In other words, while in the second (imaging) mode the display receives light from a field of view along a second direction 360. The modes also determine where and in what directions signals flow from the image capture display to processing 360 (e.g., of a mobile computing device). In a first (display) mode, display signals 325 are sent from the processing 360 to the display layer 320, while in the second (image) mode, image signals 335 are sent from the photodetector layer 330 to the processing 360.

In another possible embodiment, photodetectors are added to a display layer of an OLED display. A side sectional view of an image capture display 400 based on an OLED display is shown FIG. 4. The embodiment includes a polarizer filter 410. Light is transmitted from R, G, and B OLEDs (i.e., RGB pixels) through the polarizer filter 410 to a viewer. Without the filter 410, colors from the RGB OLEDs can appear "fuzzy" to a viewer due to switching of the OLEDs. The embodiment further includes encapsulation glass 420 which seals the RGB pixels within a vacuum. The RGB pixels are stored in the vacuum which is generated by injection similar to that used in inkjet printers. The embodiment further includes TFT film 430 which includes transistors controlled by voltages (e.g., from processing) to address and control the transmitted intensities of the RGB pixels. The embodiment further includes photodetectors P (e.g., pinned photodiodes (PPD)) on a substrate.

Figure 4:
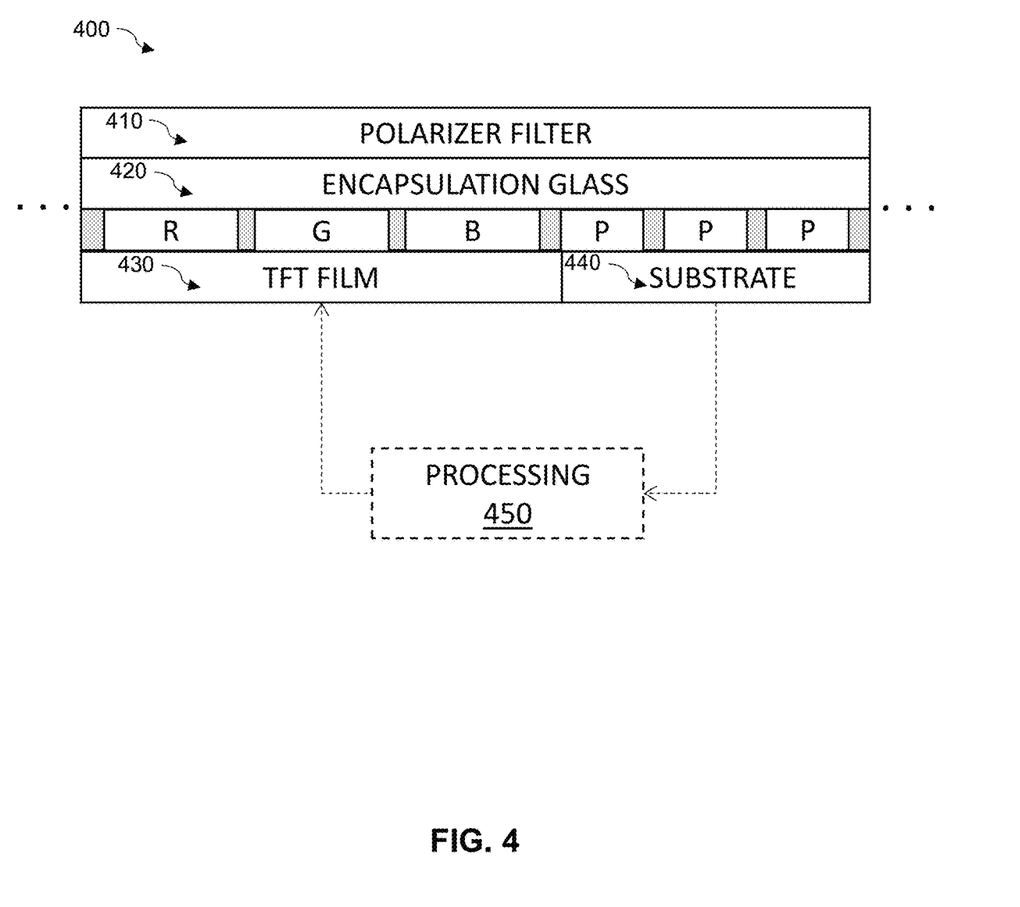
FIG. 4 depicts a side sectional view of an image capture display according to an embodiment of the present disclosure.

The encapsulation glass 420 may not be necessary for the photodetectors, P, but may be included to ease alignment and fabrication. The polarization filter 410 is needed to improve the presentation of the R, G, and B colors (e.g., remove artifacts caused by switching the OLED pixels). Both TFT film 430 and substrate 440 also serve to couple the image capture display 400 to processing 450 (e.g., of a mobile computing device). The processing 450 may include an LCD display driver that is coupled to the RGB pixels via the TFT film. The processing 450 may also include CMOS circuitry (e.g., to sample the RGB light levels) that is couple to the photodetectors via the substrate. The CMOS circuitry of the processing 450 may also include analog to digital conversion (ADC) circuitry that can send digital signals to a memory of the processing 450 or an image sensor processor (ISP) of the processing 450 to create images. The ISP can also process the images (e.g., dewarping, distortion correction, noise filtering, pixel binning, and encoding) to improve quality.

Figure 5A:
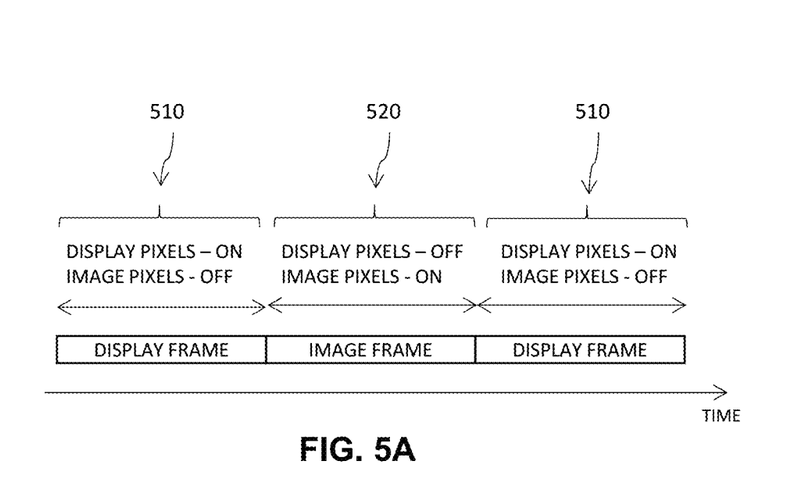
FIG. 5A depicts a timing diagram for capturing image and display frames according to a first possible embodiment of the present disclosure.

Imaging using the image capture display may require switching between modes as described previously. This may have the effect of switching the display ON/OFF to accommodate an image capture, which may include image pixel binning process (e.g., 4 image pixels combined into a single image pixel). A timing diagram for capturing images during display is shown in FIG. 5A. In a display mode 510, display frames are communicated to the display from processing. In this mode, display pixels are ON and image pixels are OFF. In an imaging mode 520, image frames are received at processing from the photodetectors. In this mode the display pixels are OFF and image pixels are ON.

The display is OFF while an image is captured, but this may not impact a user's experience significantly. Current display playback from the front camera is 60 fps but a front facing camera typically only samples between 24-30 frames per second (fps). As a result, artifacts including frame drops are normal and the user will not be able to see degradation from switching modes. In terms of capturing an image while displaying the video, the processing may include a display driver with a virtual reality (VR) mode which can output 60 fps while capturing images between frames. In some embodiments the processing may include a processor configured by non-transitory software instructions (e.g., stored in a computer readable memory) to perform the display and imaging functions described herein.

Figure 6:
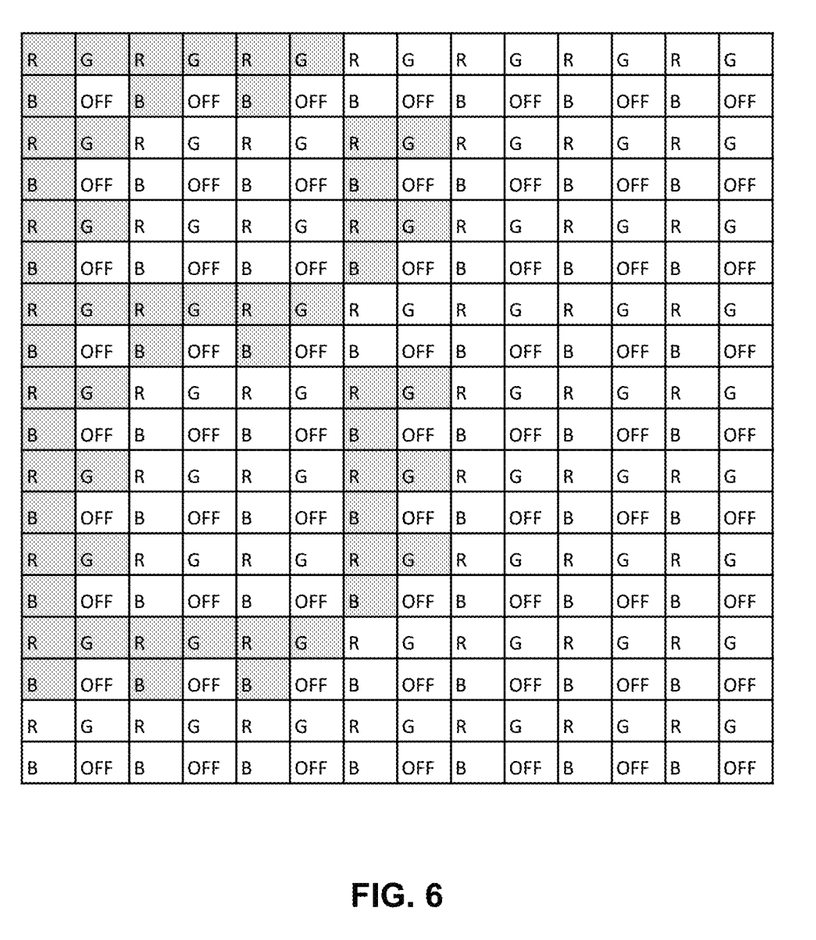
FIG. 6 depicts a portion of an image capture display displaying the letter "B".

FIG. 6 depicts a portion of an image capture display displaying the letter "B." As shown, the display is in a display mode. Accordingly, all photodetector pixels in an OFF state, while all display pixels are in an ON state. To display the letter "B" certain display pixels are active (i.e., are receiving a signal to display a color/intensity). The active display pixels corresponding to the displayed letter "B" are shaded.

Figure 7:
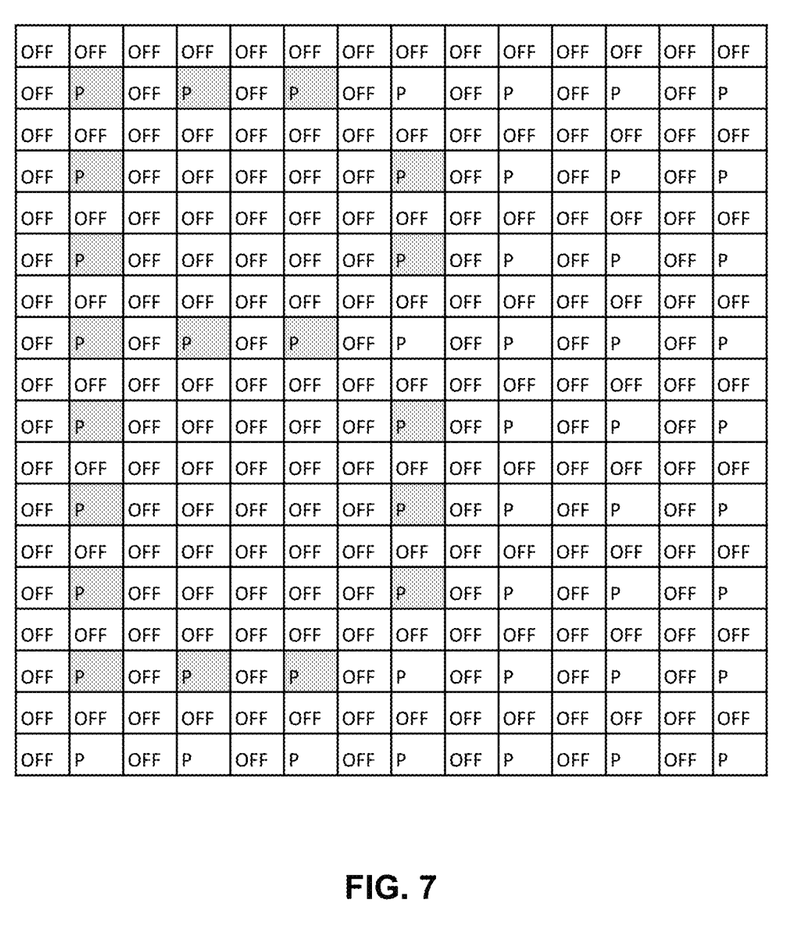
FIG. 7 depicts a portion of the image capture display of FIG. 6 capturing an image of the letter "B".

FIG. 7 depicts the same portion of the image capture display as shown in FIG. 6. As shown, the display is in an imaging mode. Accordingly, all display pixels are in an OFF state, while photodetector pixels are in an ON state. To image the letter "B" certain image pixels are active (i.e., are detecting light). The active imaging pixels corresponding to the imaged letter "B" are shaded.

Figure 8:
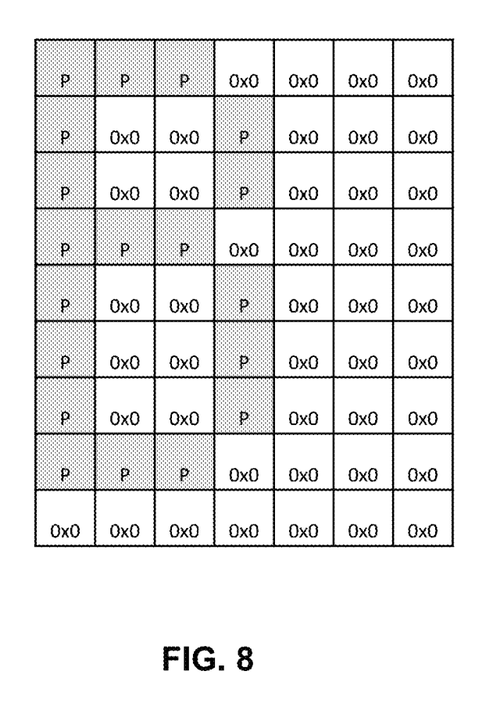
FIG. 8 depicts a memory for the image captured in FIG. 7.

The gaps between the photodetector positions are physically very small (e.g., less than 28 μm). For example, a gap of approximately 14 μm is small enough to capture the detail necessary for images typically captured by a front facing camera in a mobile computing device. From an electronic perspective there are no gaps. FIG. 8 depicts a memory for the image captured in FIG. 7. For the "B" image example, each memory space contains an intensity value, P, or zero value (i.e., 0x0). As can be observed no gaps between imaging pixels appear in the resulting image.

Figure 5B:
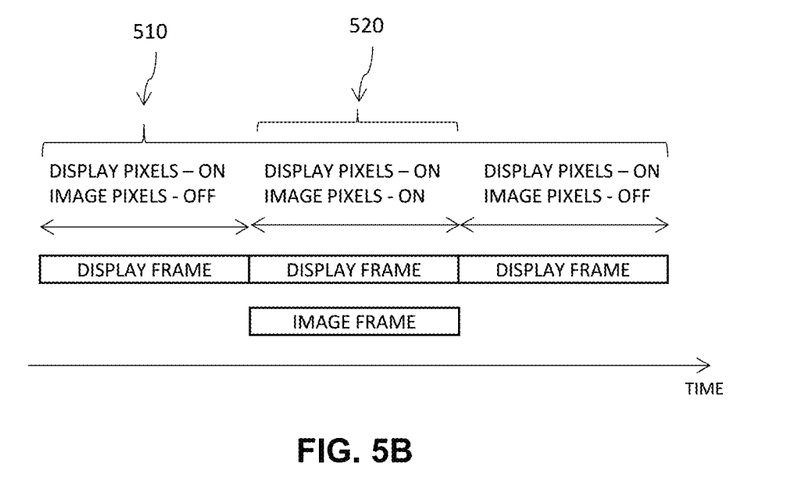
FIG. 5B depicts a timing diagram for capturing image and display frames according to a second possible embodiment of the present disclosure.

Returning to FIG. 5A, the timing diagram shows a first possible embodiment in which the displaying and the imaging of the image capture display are carried out in a sequence. The sequence requires that the display is turned OFF to obtain an image (and vice versa). A second possible embodiment is shown in FIG. 5B. Here, the displaying and imaging can occur simultaneously (i.e., in parallel). In this embodiment, the ON/OFF condition of the display pixels does not affect the ON/OFF condition of the photodetectors. For example, the display may be continuously active regardless of imaging. This approach may reduce the chances of perceiving a flicker in the display. Accordingly, this second possible embodiment may be compatible with high-performance virtual reality (VR) or gaming applications and/or modalities. Both embodiments are embraced by the present disclosure. The first embodiment (i.e., FIG. 5A) may require more significant software changes and optimization for integration with a mobile computing device than the second embodiment (i.e., FIG. 5B).

The disclosed (CMOS) image sensor embedded into a (LCD) display may offer advantages to a user of a mobile device. For example, an image can be captured even with the fingers wrapped around the mobile device. In other words, there is no risk in blocking a front-facing camera as a user holds the mobile device. Because the imaging (i.e., camera pixels) are spread out (within the area of the display), an image can be acquired from the center of the display and blocked imaging pixels may be ignored.

Figure 9:
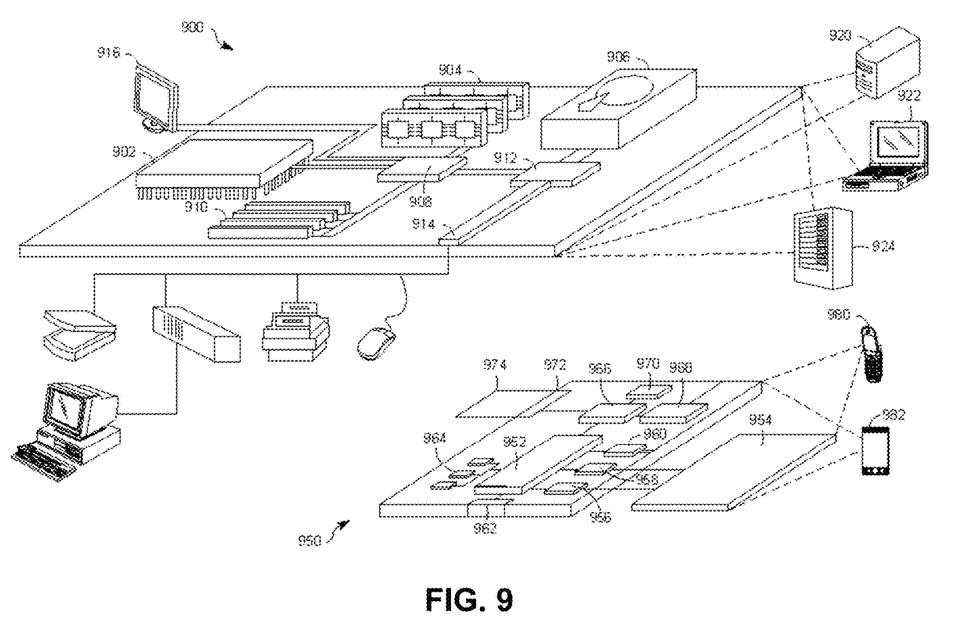
FIG. 9 shows an example of a computer device and a mobile computer device that can be used to implement the techniques described here.

FIG. 9 shows an example of a generic computer device 900 and a generic mobile computer device 950, which may be used with the techniques described here. Computing device 900 is intended to represent various forms of digital computers, such as laptops, desktops, tablets, workstations, personal digital assistants, televisions, servers, blade servers, mainframes, and other appropriate computing devices. Computing device 950 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 900 includes a processor 902, memory 904, a storage device 906, a high-speed interface 908 connecting to memory 904 and high-speed expansion ports 910, and a low speed interface 912 connecting to low speed bus 914 and storage device 906. The processor 902 can be a semiconductor-based processor. The memory 904 can be a semiconductor-based memory. Each of the components 902, 904, 906, 908, 910, and 912, are interconnected using various busses, and may be mounted on a common motherboard or in other manners as appropriate. The processor 902 can process instructions for execution within the computing device 900, including instructions stored in the memory 904 or on the storage device 906 to display graphical information for a GUI on an external input/output device, such as display 916 coupled to high speed interface 908. In other implementations, multiple processors and/or multiple buses may be used, as appropriate, along with multiple memories and types of memory. Also, multiple computing devices 900 may be connected, with each device providing portions of the necessary operations (e.g., as a server bank, a group of blade servers, or a multi-processor system).

The memory 904 stores information within the computing device 900. In one implementation, the memory 904 is a volatile memory unit or units. In another implementation, the memory 904 is a non-volatile memory unit or units. The memory 904 may also be another form of computer-readable medium, such as a magnetic or optical disk.

The storage device 906 is capable of providing mass storage for the computing device 900. In one implementation, the storage device 906 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 904, the storage device 906, or memory on processor 902.

The high speed controller 908 manages bandwidth-intensive operations for the computing device 900, while the low speed controller 912 manages lower bandwidth-intensive operations. Such allocation of functions is exemplary only. In one implementation, the high-speed controller 908 is coupled to memory 904, display 916 (e.g., through a graphics processor or accelerator), and to high-speed expansion ports 910, which may accept various expansion cards (not shown). In the implementation, low-speed controller 912 is coupled to storage device 906 and low-speed expansion port 914. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 900 may be implemented in a number of different forms, as shown in the figure. For example, it may be implemented as a standard server 920, or multiple times in a group of such servers. It may also be implemented as part of a rack server system 924. In addition, it may be implemented in a personal computer such as a laptop computer 922. Alternatively, components from computing device 900 may be combined with other components in a mobile device (not shown), such as device 950. Each of such devices may contain one or more of computing device 900, 950, and an entire system may be made up of multiple computing devices 900, 950 communicating with each other.

Computing device 950 includes a processor 952, memory 964, an input/output device such as a display 954, a communication interface 966, and a transceiver 968, among other components. The device 950 may also be provided with a storage device, such as a microdrive or other device, to provide additional storage. Each of the components 950, 952, 964, 954, 966, and 968, are interconnected using various buses, and several of the components may be mounted on a common motherboard or in other manners as appropriate.

The processor 952 can execute instructions within the computing device 950, including instructions stored in the memory 964. The processor may be implemented as a chipset of chips that include separate and multiple analog and digital processors. The processor may provide, for example, for coordination of the other components of the device 950, such as control of user interfaces, applications run by device 950, and wireless communication by device 950.

Processor 952 may communicate with a user through control interface 958 and display interface 956 coupled to a display 954. The display 954 may be, for example, a TFT LCD (Thin-Film-Transistor Liquid Crystal Display) or an OLED (Organic Light Emitting Diode) display, or other appropriate display technology. The display interface 956 may comprise appropriate circuitry for driving the display 954 to present graphical and other information to a user. The control interface 958 may receive commands from a user and convert them for submission to the processor 952. In addition, an external interface 962 may be provided in communication with processor 952, so as to enable near area communication of device 950 with other devices. External interface 962 may provide, for example, for wired communication in some implementations, or for wireless communication in other implementations, and multiple interfaces may also be used.

The memory 964 stores information within the computing device 950. The memory 964 can be implemented as one or more of a computer-readable medium or media, a volatile memory unit or units, or a non-volatile memory unit or units. Expansion memory 974 may also be provided and connected to device 950 through expansion interface 972, which may include, for example, a SIMM (Single In Line Memory Module) card interface. Such expansion memory 974 may provide extra storage space for device 950, or may also store applications or other information for device 950. Specifically, expansion memory 974 may include instructions to carry out or supplement the processes described above, and may include secure information also. Thus, for example, expansion memory 974 may be provided as a security module for device 950, and may be programmed with instructions that permit secure use of device 950. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 964, expansion memory 974, or memory on processor 952, that may be received, for example, over transceiver 968 or external interface 962.

Device 950 may communicate wirelessly through communication interface 966, which may include digital signal processing circuitry where necessary. Communication interface 966 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 968. In addition, short-range communication may occur, such as using a Bluetooth, WiFi, or other such transceiver (not shown). In addition, GPS (Global Positioning System) receiver module 970 may provide additional navigation- and location-related wireless data to device 950, which may be used as appropriate by applications running on device 950.

Device 950 may also communicate audibly using audio codec 960, which may receive spoken information from a user and convert it to usable digital information. Audio codec 960 may likewise generate audible sound for a user, such as through a speaker, e.g., in a handset of device 950. Such sound may include sound from voice telephone calls, may include recorded sound (e.g., voice messages, music files, etc.) and may also include sound generated by applications operating on device 950.

The computing device 950 may be implemented in a number of different forms, as shown in the figure. For example, it may be implemented as a cellular telephone 980. It may also be implemented as part of a smart phone 982, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of embodiments have been described. Nevertheless, it will be understood that various modifications may be made without departing from the spirit and scope of the invention.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A display configured for capturing images while rendering a video, the display comprising:
    a plurality of contiguous pixel areas, wherein each pixel area is divided into a plurality of display subpixels and a photodetector that includes a plurality of imaging pixels and a lens configured for imaging light onto the imaging pixels,
        wherein the display subpixels of the plurality of contiguous pixel areas are configured for displaying images on the display,
        wherein the photodetectors of the plurality of contiguous pixel areas are configured for capturing images from light received by the photodetectors, and
        wherein the display is configured to operate in a display mode in which frames of a video are displayed to a user using the display subpixels at a rate of greater than or equal to 24 frames per second, and
        wherein the display is configured to operate, between times at which frames of the video are displayed to the user using the display subpixels when the display is operated in the display mode, in an imaging mode in which images from a field of view of the display are captured between the display of frames of the video using the photodetectors.

2. The display according to claim 1, wherein the display includes a thin film transistor (TFT) liquid crystal display (LCD).

3. The display according to claim 2,
    wherein when the display is configured to operate in the display mode, light from light source in the display is spatially modulated by subpixels in a display layer of the display and is colorized by Bayer subpixel filters in the display, and
    wherein when the display is configured to operate in the imaging mode, light from the field of view is passed through a Bayer filter layer before reaching photodetectors on photodetector layer of the display.

4. The display according to claim 1, wherein the display includes an OLED display.

5. The display according to claim 1, wherein the display includes a Bayer filter, the Bayer filter arranged so that (i) light from a first subpixel of a pixel area of the plurality of contiguous pixel areas is displayed through a red filter, (ii) light from a second subpixel of the pixel area of the plurality of contiguous pixel areas is displayed through a blue filter, and (iii) light from a third subpixel of the pixel area of the plurality of contiguous pixel areas is displayed through a green filter.

6. The display according to claim 1, wherein the display subpixels and the photodetectors of the pixel areas of the plurality of contiguous pixel areas are arranged on a display layer and a photodetector layer, respectively, of the display.

7. The display according to claim 1, wherein the display subpixels and the photodetectors of the pixel areas of the plurality of contiguous pixel areas are arranged on the same layer of the display.

8. The display according to claim 1, wherein each photodetector of a pixel area of the plurality of contiguous pixels areas includes a plurality of pinned photodiodes and a Bayer filter.

9. The display according to claim 1, wherein each pixel area is a square area having sides of approximately 28 micrometers.

10. The display according to claim 1, wherein the display is configured to operate in the imaging mode, at times when frames of video information are displayed using the display subpixels.

11. A mobile computing device comprising:
a display configured for capturing images while rendering a video, wherein the display includes a plurality of contiguous pixel areas, wherein each pixel area is divided a plurality of display subpixels and a photodetector that includes a plurality of imaging pixels and a lens configured for imaging light onto the imaging pixels,
wherein the display subpixels of the plurality of contiguous pixel areas are configured for displaying images on the display,
wherein the photodetectors of the plurality of contiguous pixel areas are configured for capturing images from light received by the photodetectors; and
a processor coupled to the display and configured by software to configure the display to operate in a display mode in which frames of a video are displayed to a user using the display subpixels at a rate of greater than or equal to 24 frames per second and to operate, between times at which frames of the video are displayed to the user using the display subpixels when the display is operated in the display mode, in in an imaging mode in which images from a field of view of the display are captured between the display of frames of the video using the photodetectors.

12. The mobile computing device according to claim 11, wherein the display includes a thin film transistor (TFT) liquid crystal display (LCD).

13. The mobile computing device according to claim 12, wherein when the display is configured to operate in the display mode, light from light source in the display is spatially modulated by subpixels in a display layer of the display and is colorized by Bayer subpixel filters in the display, and
wherein when the display is configured to operate in the imaging mode, light from the field of view is passed through a Bayer filter layer before reaching photodetectors on photodetector layer of the display.

14. The mobile computing device according to claim 12, wherein the display is configured to operate in the imaging mode, at times when frames of video information are displayed using the display subpixels.

15. The mobile computing device according to claim 11, wherein the display includes an OLED display.

16. The mobile computing device according to claim 11, wherein the display includes a Bayer filter, the Bayer filter arranged so that (i) light from a first subpixel of a pixel area of the plurality of contiguous pixel areas is displayed through a red filter, (ii) light from a second subpixel of the pixel area of the plurality of contiguous pixel areas is displayed through a blue filter, and (iii) light from a third subpixel of the pixel area of the plurality of contiguous pixel areas is displayed through a green filter.

17. The mobile computing device according to claim 11, wherein the display subpixels and the photodetectors of the pixel areas of the plurality of contiguous pixel areas are arranged on a display layer and a photodetector layer, respectively, of the display.

18. The mobile computing device according to claim 11, wherein the display subpixels and the photodetectors of the pixel areas of the plurality of contiguous pixel areas are arranged on the same layer of the display.

19. The mobile computing device according to claim 11, wherein each photodetector of a pixel area of the plurality of contiguous pixels areas includes a plurality of pinned photodiodes and a Bayer filter.

20. The mobile computing device according to claim 11, wherein each pixel area is a square area having sides of approximately 28 micrometers.

* * * * *